(12) United States Patent
Campbell et al.

(10) Patent No.: US 8,985,847 B2
(45) Date of Patent: Mar. 24, 2015

(54) THERMAL RESISTANCE-BASED MONITORING OF COOLING OF AN ELECTRONIC COMPONENT

(75) Inventors: Levi A. Campbell, Poughkeepsie, NY (US); Richard C. Chu, Hopewell Junction, NY (US); Milnes P. David, Fishkill, NY (US); Michael J. Ellsworth, Jr., Lagrangeville, NY (US); Madhusudan K. Iyengar, Woodstock, NY (US); Robert E. Simons, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 651 days.

(21) Appl. No.: 13/300,803

(22) Filed: Nov. 21, 2011

(65) Prior Publication Data
US 2013/0128918 A1   May 23, 2013

(51) Int. Cl.
G01N 3/60 (2006.01)
G01N 17/00 (2006.01)
G01N 25/16 (2006.01)
G01N 25/00 (2006.01)
H05K 7/20 (2006.01)

(52) U.S. Cl.
CPC ............................ H05K 7/20836 (2013.01)
USPC ........................ 374/57; 374/55; 374/45

(58) Field of Classification Search
USPC .................................. 374/57, 55, 45
See application file for complete search history.

(56) References Cited

U.S. PATENT DOCUMENTS

| 5,970,731 | A | 10/1999 | Hare et al. |
|---|---|---|---|
| 6,923,570 | B2 | 8/2005 | Shih et al. |
| 7,581,878 | B2 | 9/2009 | Lee et al. |
| 7,651,260 | B2 | 1/2010 | Hamann et al. |
| 7,883,266 | B2 | 2/2011 | Campbell et al. |
| 2006/0045165 | A1* | 3/2006 | Chan et al. ............... 374/43 |
| 2009/0281761 | A1* | 11/2009 | Bandholz et al. ......... 702/132 |
| 2010/0034235 | A1* | 2/2010 | Chen .......................... 374/44 |
| 2010/0046574 | A1 | 2/2010 | Hamann et al. |

* cited by examiner

*Primary Examiner* — Lisa Caputo
*Assistant Examiner* — Jamel Williams
(74) *Attorney, Agent, or Firm* — Steven Chiu, Esq.; Kevin P. Radigan, Esq.; Heslin Rothenberg Farley & Mesiti P.C.

(57) ABSTRACT

Monitoring of cooling of an electronic component is provided, which includes: determining a current thermal resistance associated with one or more of the electronic component, a heat sink coupled to the electronic component, or a thermal interface coupling the electronic component and the heat sink; and determining, by a processor, whether the current thermal resistance exceeds a set thermal resistance threshold, and responsive to the current thermal resistance exceeding the set thermal resistance threshold, indicating a thermal resistance fault. As an enhancement, rate of change over time of the thermal resistance is determined, and compared against a rate of change threshold, and if exceeding the threshold, a rate of change thermal resistance warning is provided.

17 Claims, 7 Drawing Sheets

THERMAL RESISTANCE-BASED MONITORING OF COOLING OF AN ELECTRONIC COMPONENT

BACKGROUND

The power dissipation of integrated circuit chips, and the modules containing the chips, continues to increase in order to achieve increases in processor performance. This trend poses a cooling challenge at both the module and system level. Increased airflow rates are needed to effectively cool high power modules and to limit the temperature of the air that is exhausted into the computer center.

In many large server applications, processors along with their associated electronics (e.g., memory, disk drives, power supplies, etc.) are packaged in removable node configurations stacked within an electronics (or IT) rack or frame. In other cases, the electronics may be in fixed locations within the rack or frame. Typically, the components are cooled by air moving in parallel airflow paths, usually front-to-back, impelled by one or more air moving devices (e.g., fans or blowers). In some cases it may be possible to handle increased power dissipation within a single node by providing greater airflow, through the use of a more powerful air moving device or by increasing the rotational speed (i.e., RPMs) of an existing air moving device. However, this approach is becoming problematic at the rack level in the context of a computer installation (i.e., data center).

The sensible heat load carried by the air exiting the rack is stressing the capability of the room air-conditioning to effectively handle the load. This is especially true for large installations with "server farms" or large banks of computer racks located close together. In such installations, liquid cooling (e.g., water cooling) is an attractive technology to manage the higher heat fluxes. The liquid absorbs the heat dissipated by the components/modules in an efficient manner. Typically, the heat is ultimately transferred from the liquid to an outside environment, whether air or other liquid coolant.

BRIEF SUMMARY

In one aspect, the shortcomings of the prior art are overcome and additional advantages are provided through the provision of a method comprising monitoring cooling of an electronic component. The monitoring includes: determining a current thermal resistance associated with at least one of the electronic component, a heat sink coupled to the electronic component, or a thermal interface coupling the electronic component and the heat sink; and determining, by a processor, whether the current thermal resistance exceeds a set thermal resistance threshold, and responsive to the current thermal resistance exceeding the set thermal resistance threshold, indicating a thermal resistance fault.

In another aspect, a cooling apparatus is provided which includes a heat sink, a thermal interface coupling the heat sink to an electronic component to be cooled, and a controller for monitoring cooling of the electronic component. The monitoring includes: determining a current thermal resistance associated with at least one of the electronic component, the heat sink coupled to the electronic component, or the thermal interface coupling the electronic component and the heat sink; and determining whether the current thermal resistance exceeds a set thermal resistance threshold, and responsive to the current thermal resistance exceeding the set thermal resistance threshold, indicating a thermal resistance fault.

In a further aspect, a cooled electronic system is provided which includes an electronic component, a heat sink, a thermal interface coupling the electronic component and the heat sink, and a controller configured to monitor cooling of the electronic component. The monitoring includes: determining a current thermal resistance associated with at least one of the electronic component, the heat sink coupled to the electronic component, or the thermal interface coupling the electronic component and the heat sink; and determining whether the current thermal resistance exceeds a set thermal resistance threshold, and responsive to the current thermal resistance exceeding the set thermal resistance threshold, indicating a thermal resistance fault.

Additional features and advantages are realized through the techniques of the present invention. Other embodiments and aspects of the invention are described in detail herein and are considered a part of the claimed invention.

BRIEF DESCRIPTION OF THE SEVERAL VIEWS OF THE DRAWINGS

One or more aspects of the present invention are particularly pointed out and distinctly claimed as examples in the claims at the conclusion of the specification. The foregoing and other objects, features, and advantages of the invention are apparent from the following detailed description taken in conjunction with the accompanying drawings in which:

DETAILED DESCRIPTION

Figure 1:
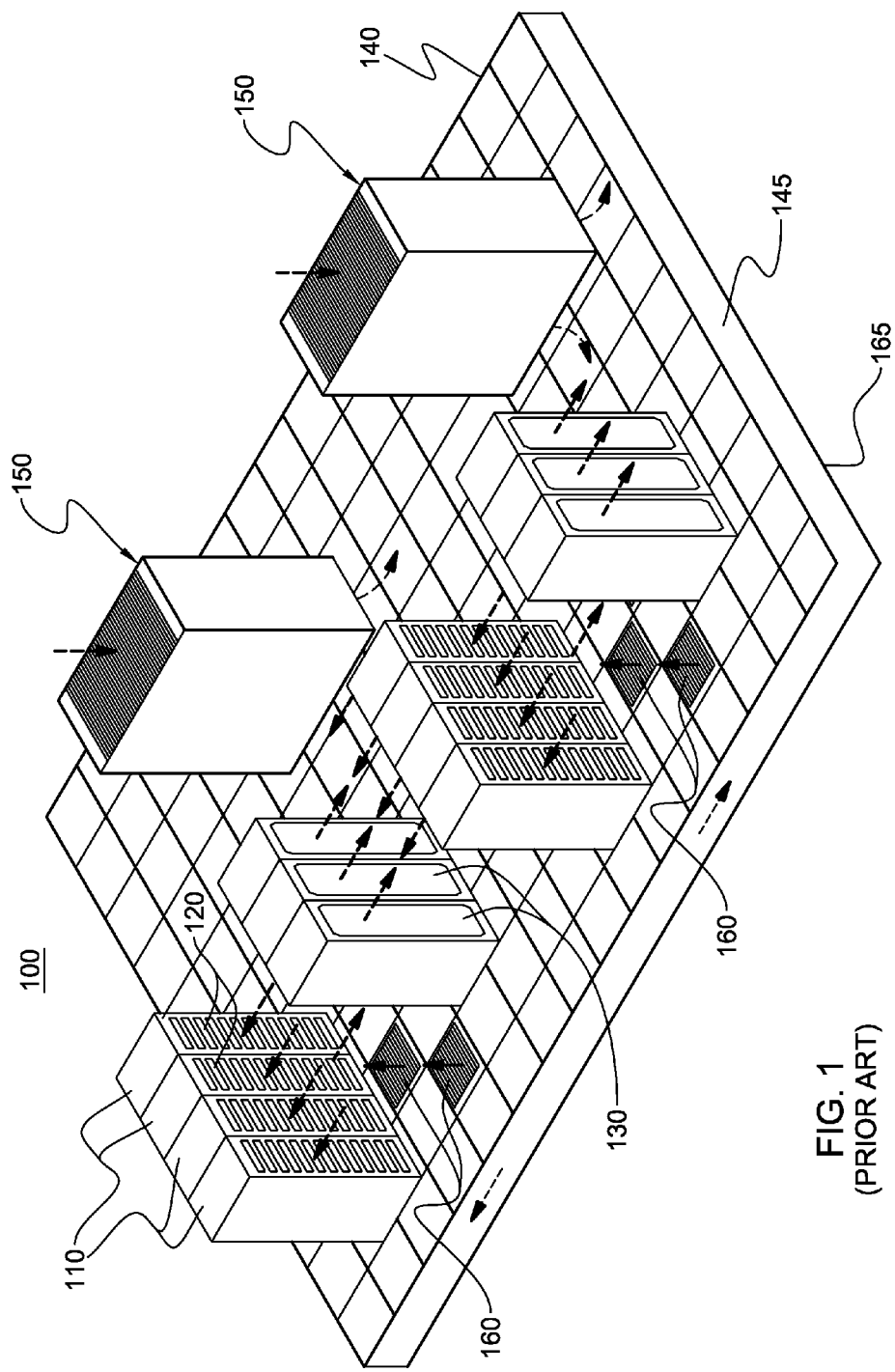
FIG. 1 depicts one embodiment of a conventional raised floor layout of an air-cooled data center.

As used herein, the terms "electronics rack", "rack-mounted electronic equipment", and "rack unit" are used interchangeably, and unless otherwise specified include any housing, frame, rack, compartment, blade server system, etc., having one or more heat generating components of a computer system or electronics system, and may be, for example, a stand alone computer processor having high, mid or low end processing capability. In one embodiment, an electronics rack may comprise an IT rack with multiple electronic subsystems, each having one or more heat generating components disposed therein requiring cooling. "Electronic subsystem" refers to any sub-housing, blade, book, drawer, node, compartment, etc., having one or more heat generating electronic components disposed therein. Each electronic subsystem of an electronics rack may be movable or fixed relative to the electronics rack, with rack-mounted electronics drawers of a multi-drawer rack unit and blades of a blade center system being two examples of subsystems of an electronics rack to be cooled.

"Electronic component" refers to any heat generating electronic component or module of, for example, a computer system or other electronic unit requiring cooling. By way of example, an electronic component may comprise one or more integrated circuit dies and/or other electronic devices to be cooled, including one or more processor dies, memory dies and memory support dies. As a further example, the electronic component may comprise one or more bare dies or one or more packaged dies disposed on a common carrier. Further, unless otherwise specified herein, the term "liquid-cooled cold plate" or "coolant-cooled structure" refers to any thermally conductive structure having a plurality of channels (or passageways) formed therein for flowing of coolant therethrough. A "coolant-cooled structure" may function, in one example, as a refrigerant evaporator, or more broadly, as a "heat sink" such as discussed and claimed herein. A cold plate is one example of a heat sink.

As used herein, "refrigerant-to-air heat exchanger" means any heat exchange mechanism characterized as described herein through which refrigerant coolant can circulate; and includes, one or more discrete refrigerant-to-air heat exchangers coupled either in series or in parallel. A refrigerant-to-air heat exchanger may comprise, for example, one or more coolant flow paths, formed of thermally conductive tubing (such as copper or other tubing) in thermal or mechanical contact with a plurality of air-cooled cooling or condensing fins. Size, configuration and construction of the refrigerant-to-air heat exchanger can vary without departing from the scope of the invention disclosed herein.

Unless otherwise specified, "refrigerant evaporator" refers to a heat-absorbing mechanism or structure within a refrigeration loop. The refrigerant evaporator is alternatively referred to as a "sub-ambient evaporator" when temperature of the refrigerant passing through the refrigerant evaporator is below the temperature of ambient air entering the electronics rack. In one example, the refrigerant evaporator comprises a coolant-to-refrigerant heat exchanger. Within the refrigerant evaporator, heat is absorbed by evaporating the refrigerant of the refrigerant loop. Still further, "data center" refers to a computer installation containing one or more electronics racks to be cooled. As a specific example, a data center may include one or more rows of rack-mounted computing units, such as server units.

One example of the refrigerant employed in the examples below is R134a refrigerant. However, the concepts disclosed herein are readily adapted to use with other types of refrigerant. For example, R245fa, R404, R12, or R22 refrigerant may be employed.

Reference is made below to the drawings, which are not drawn to scale for ease of understanding, wherein the same reference numbers used throughout different figures designate the same or similar components.

FIG. 1 depicts a raised floor layout of an air cooled data center 100 typical in the prior art, wherein multiple electronics racks 110 are disposed in one or more rows. A data center such as depicted in FIG. 1 may house several hundred, or even several thousand microprocessors. In the arrangement illustrated, chilled air enters the computer room via perforated floor tiles 160 from a supply air plenum 145 defined between the raised floor 140 and a base or sub-floor 165 of the room. Cooled air is taken in through louvered or screened doors at air inlet sides 120 of the electronics racks and expelled through the back (i.e., air outlet sides 130) of the electronics racks. Each electronics rack 110 may have one or more air moving devices (e.g., fans or blowers) to provide forced inlet-to-outlet airflow to cool the electronic components within the drawer(s) of the rack. The supply air plenum 145 provides conditioned and cooled air to the air-inlet sides of the electronics racks via perforated floor tiles 160 disposed in a "cold" aisle of the computer installation. The conditioned and cooled air is supplied to plenum 145 by one or more air conditioning units 150, also disposed within the data center 100. Room air is taken into each air conditioning unit 150 near an upper portion thereof. This room air comprises in part exhausted air from the "hot" aisles of the computer installation defined by opposing air outlet sides 130 of the electronics racks 110.

In high performance server systems, it has become desirable to supplement air-cooling of selected high heat flux electronic components, such as the processor modules, within the electronics rack. For example, the System z® server marketed by International Business Machines Corporation, of Armonk, N.Y., employs a vapor-compression refrigeration cooling system to facilitate cooling of the processor modules within the electronics rack. This refrigeration system employs R134a refrigerant as the coolant, which is supplied to a refrigerant evaporator coupled to one or more processor modules to be cooled. The refrigerant is provided by a modular refrigeration unit (MRU), which supplies the refrigerant at an appropriate temperature.

Figure 2B:
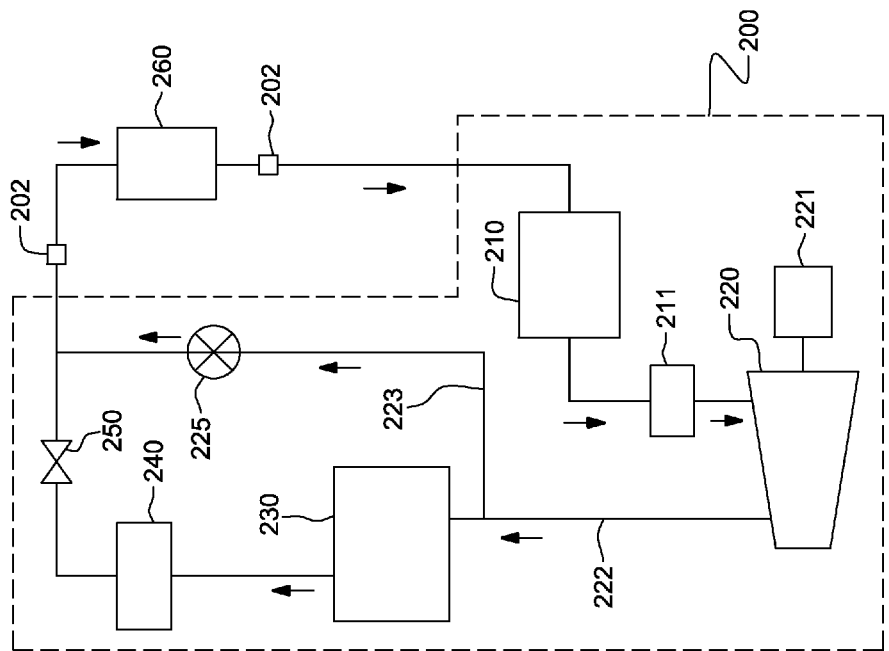
FIG. 2B is a schematic of one embodiment of a vapor-compression refrigeration system for cooling a heat sink coupled to an electronic component (e.g., module) to be cooled, in accordance with one or more aspects of the present invention.
Figure 2A:
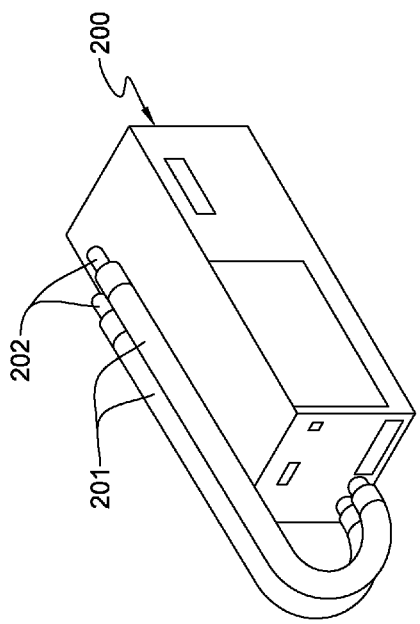
FIG. 2A is an isometric view of one embodiment of a modular refrigeration unit (MRU) and its quick connects for attachment to a heat sink, such as a cold plate or evaporator, disposed (for example) within an electronics rack to cool one or more electronic components (e.g., modules) thereof, in accordance with one or more aspects of the present invention.

FIG. 2A depicts one embodiment of a modular refrigeration unit 200, which may be employed within an electronic rack, in accordance with an aspect of the present invention. As illustrated, modular refrigeration unit 200 includes refrigerant supply and exhaust hoses 201 for coupling to a refrigerant evaporator or cold plate (not shown), as well as quick connect couplings 202, which respectively connect to corresponding quick connect couplings on either side of the refrigerant evaporator, that is coupled to the electronic component(s) or module(s) (e.g., server module(s)) to be cooled. Further details of a modular refrigeration unit such as depicted in FIG. 2A are provided in commonly assigned U.S. Pat. No. 5,970,731.

FIG. 2B is a schematic of one embodiment of modular refrigeration unit 200 of FIG. 2A, coupled to a refrigerant evaporator for cooling, for example, an electronic component within an electronic subsystem of an electronics rack. The electronic component may comprise, for example, a multichip module, a processor module, or any other high heat flux electronic component (not shown) within the electronics rack. As illustrated in FIG. 2B, a refrigerant evaporator 260 is shown that is coupled to the electronic component (not shown) to be cooled and is connected to modular refrigeration unit 200 via respective quick connect couplings 202. Within modular refrigeration unit 200, a motor 221 drives a compressor 220, which is connected to a condenser 230 by means of a supply line 222. Likewise, condenser 230 is connected to evaporator 260 by means of a supply line which passes through a filter/dryer 240, which functions to trap particulate matter present in the refrigerant stream and also to remove any water which may have become entrained in the refrigerant flow. Subsequent to filter/dryer 240, refrigerant flow passes through an expansion device 250. Expansion device 250 may be an expansion valve. However, it may also comprise a capillary tube or thermostatic valve. Thus, expanded and cooled refrigerant is supplied to evaporator 260. Subsequent to the refrigerant picking up heat from the electronic component coupled to evaporator 260, the refrigerant is returned via an accumulator 210 which operates to prevent liquid from entering compressor 220. Accumulator 210 is also aided in this function by the inclusion of a smaller capacity accumulator 211, which is included to provide an extra degree of protection against the entry of liquid-phase refrigerant into compressor 220. Subsequent to accumulator 210, vapor-phase refrigerant is returned to compressor 220, where the cycle repeats. In addition, the modular refrigeration unit is provided with a hot gas bypass valve 225 in a bypass line 223 selectively passing hot refrigerant gasses from compressor 220 directly to evaporator 260. The hot gas bypass valve is controllable in response to the temperature of evaporator 260, which is provided by a module temperature sensor (not shown), such as a thermistor device affixed to the evaporator/cold plate in any convenient location. In one embodiment, the hot gas bypass valve is electronically controlled to shunt hot gas directly to the evaporator when temperature is already sufficiently low. In particular, under low temperature conditions, motor 221 runs at a lower speed in response to the reduced thermal load. At these lower speeds and loads, there is a risk of motor 221 stalling. Upon detection of such a condition, the hot gas bypass valve is opened in response to a signal supplied to it from a controller of the modular refrigeration unit.

Figure 3:
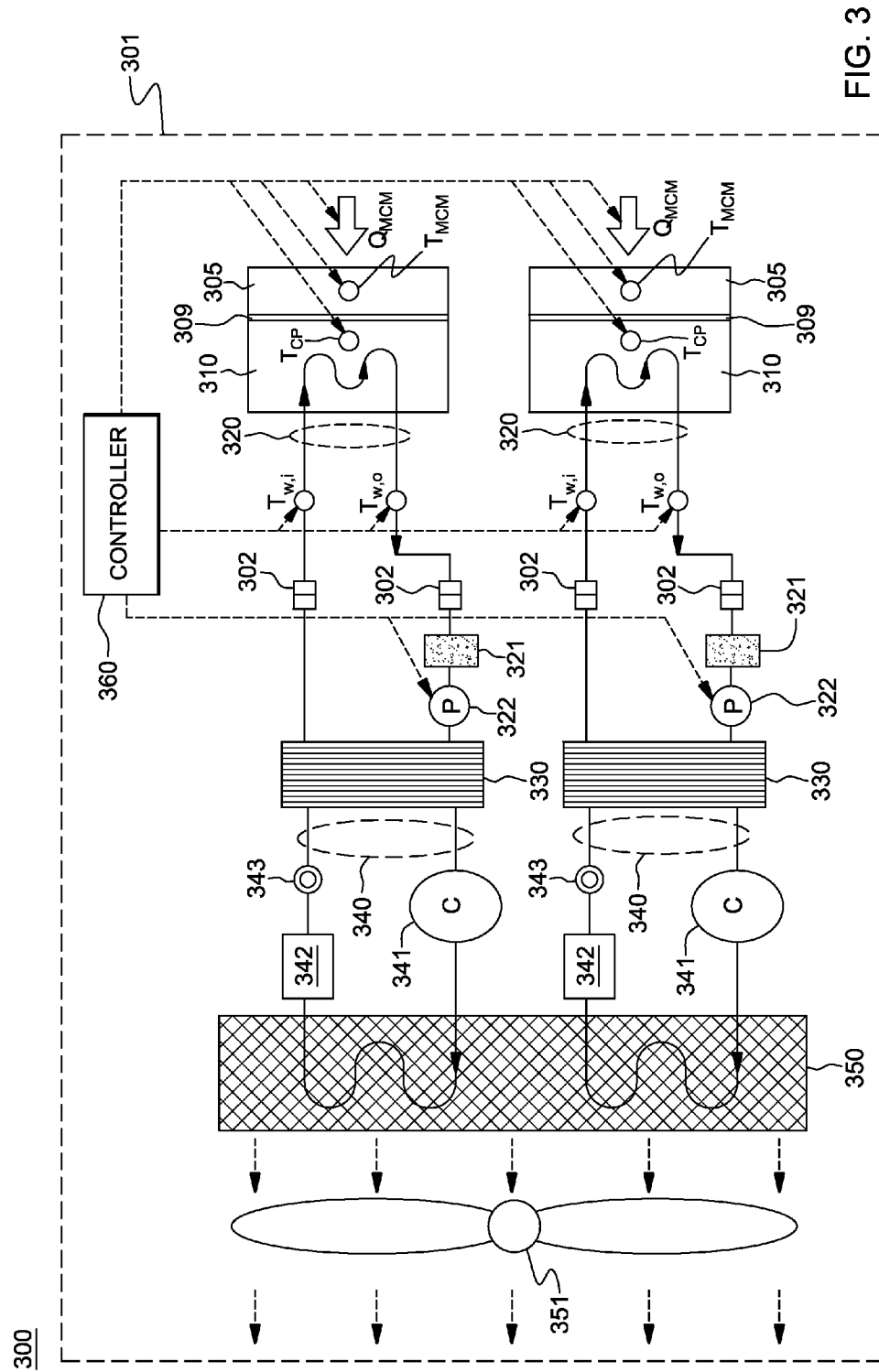
FIG. 3 is an schematic of an alternate embodiment of a coolant-buffered, vapor-compression refrigeration system for cooling one or more heat sinks (or evaporators) coupled to respective electronic components to be cooled, in accordance with one or more aspects of the present invention.

In accordance with another aspect of the present invention, FIG. 3 depicts an alternate implementation of a cooling apparatus which does not require a mechanical flow control and adjustable expansion valve, and which ensures that the refrigerant fluid enters the compressor of the vapor-compression refrigeration subsystem in a super-heated thermodynamic state. In the embodiment of FIG. 3, a dual loop, cooled electronic system is depicted by way of example. However, those skilled in the art should note that the cooling apparatus depicted therein and described below can be readily configured for cooling a single electronic component, or a plurality of electronic components (either with our without employing a shared condenser, as in the example of FIG. 3).

As shown in FIG. 3, cooled electronic system 300 includes an electronics rack 301 comprising multiple electronic components 305 to be cooled. By way of specific example, each electronic component 305 to be cooled by the cooling apparatus may be a multichip module (MCM), such as a processor MCM. In the illustrated implementation, the apparatus is a coolant-buffered, vapor-compression refrigeration apparatus with a controlled coolant heat load. Coolant buffering is achieved by associating a coolant-cooled structure 310 (or heat sink) with the respective electronic component 305 to be cooled. A coolant loop 320 is coupled in fluid communication with coolant-cooled structure 310 to allow for the ingress and egress of coolant through the structure, and quick connect couplings 302 facilitate coupling of coolant-cooled structure 310 to the balance of the respective cooling apparatus. Each coolant loop 320 is also in fluid communication with a coolant reservoir 321, a coolant pump 322 (which may be adjustable, depending on the implementation), and a coolant-to-refrigerant heat exchanger 330.

Each respective vapor-compression refrigeration subsystem of the cooling apparatus includes a refrigerant loop 340 in fluid communication with coolant-to-refrigerant heat exchanger 330, a compressor 341, a condenser section passing through a shared condenser 350, a filter/dryer 342, and a fixed orifice expansion valve 343. As illustrated, an air-moving device 351 facilitates air flow across shared condenser 350. Note that, in an alternate implementation, each vapor-compression refrigeration subsystem of the cooling apparatus could incorporate its own condenser and air-moving device.

A controller 360 is provided coupled in communication with the coolant pumps 322 to read and control pump RPMs, as well as to coolant (e.g., water) temperature sensors ($T_{w,i}$, $T_{w,o}$), heat sink (or cold plate) temperature sensors ($T_{cp}$), and electronic component (or MCM) temperature sensors ($T_{MCM}$), as described below with reference to the monitoring and control process of FIG. 4. Rather than calculating heat load as explained below, MCM heat load sensors ($Q_{MCM}$) may optionally be provided to directly measure power dissipation of the respective electronic component(s), in one example. Note also with reference to FIG. 3, that a thermal interface 309, such as a thermal interface material (TIM), couples the multichip module (or, more broadly, electronic component) 305 to the coolant-cooled structure (or, more broadly, heat sink) 310.

In operation, electronic component 305 applies a heat load $Q_{MCM}$ across the thermal interface 309 to coolant passing through liquid-cooled structure 310. Coolant pump 322 circulates coolant through coolant loop 320. Refrigerant loop 340 absorbs the heat load from the coolant passing through heat exchanger 330 and rejects this heat to an air stream via air-cooled condenser 350. Advantageously, by ensuring that coolant passing through heat exchanger 330 dissipates at least a minimum heat load to the refrigerant, compressor 341 within refrigerant loop 340 can work at a fixed speed, and a fixed orifice 343 can be used within refrigerant loop 340 as an expansion valve for the vapor-compression refrigeration loop. Note that an adjustable, auxiliary heat load can be applied by a controllable coolant heater (not shown) to the coolant so that the desired, minimum heat load can be maintained at the refrigeration loop, and by prespecifying this minimum heat load, super-heated refrigerant can be guaranteed to enter the compressor, allowing for a reliable design of the vapor-compression refrigeration subsystem.

As noted, heat flux in electronic component packaging, such as microprocessor packages, continues to increase with increasing performance. Reliably controlling such package temperatures within established limits is important for proper functioning and performance of the electronic component(s). For example, leakage current increases with component temperature, maximum clock speeds decrease with higher temperature, and reliability decreases with higher temperature.

Multiple layers of packaging may be employed in an electronic component to provide physical protection and electrical connectivity to the component, such as a processor die. These layers include, for instance, a substrate, electrical connects, the die itself, a first thermal interface within the package or module, a module lid, and a second thermal interface coupling the electronic component to a heat sink, such as a liquid-cooled cold plate. Internal package layers, such as the lid and die, typically have fixed characteristics with respect to time, and their dimensions and thermal resistances tend to remain stable. The second (or outer) thermal interface material coupling the electronic component to the heat sink, however, is often exposed to the environment, and can even be reworked if, for example, maintenance is desired. Also, many thermal interface materials used today have properties that change over time and with changes in applied pressure. Adverse changes in thermal performance of the overall cooled assembly can cause poor performance or even failure of the packaged electronics.

Disclosed hereinbelow therefore is a monitoring process which facilitates identification of a cause of thermal performance degradation prior to initiating any maintenance action on the system. In particular, disclosed herein is a monitoring method for determining the stability of the thermal resistance of, for example, an electronic component, a heat sink coupled to the electronic component, and/or a thermal interface coupling the electronic component and the heat sink. The monitoring method provides a means to identify the cause of thermal parameter changes, including indicating a faulty element, as well as a mechanism to allow health monitoring of a cooled electronic component (or system) so as to predict future cooling issues or failures. In one embodiment, temperature and power data for the electronic component to be cooled are obtained, as well as cooling data for the heat sink. This information is then employed in calculating one or more thermal resistances, which are then compared to thermal resistance thresholds or target values corresponding to, for example, maximum acceptable operational thermal resistance thresholds for the cooled electronic assembly at issue.

Generally stated, provided herein is a method which includes dynamically monitoring cooling of an electronic component by determining a current thermal resistance associated with at least one of the electronic component, a heat sink coupled to the electronic component, or a thermal interface material coupling the electronic component and the heat sink; and determining, by a processor or a controller, whether the current thermal resistance exceeds a set thermal resistance threshold, and if so, indicating a thermal resistance fault. In the detailed embodiments described herein, the indicated thermal resistance fault also identifies the particular element (for example, electronic component, heat sink or thermal interface coupling the heat sink and electronic component) for which the thermal resistance fails to meet an associated thermal resistance threshold. Thus, servicing of the electronic system is facilitated by identifying, ahead of any maintenance operation, the particular element with degraded thermal performance.

Health monitoring is enhanced by determining a rate of change over time of the thermal resistance associated with at least one of the electronic component, the heat sink coupled to the electronic component, or the thermal interface coupling the electronic component and the heat sink. The controller then determines whether the rate of change over time of the current thermal resistance exceeds a set rate of change threshold for the corresponding element, and responsive to the rate of change of the current thermal resistance exceeding the set rate of change threshold, indicates a rate of change thermal resistance warning. By periodically repeating the rate of change determining and evaluation, the monitoring method can provide an early indication of which element may fail thermal analysis in the future due to a current rate of change slope exceeding a corresponding rate of change threshold for that component.

Table 1 describes certain variables employed by the example monitoring processes depicted in FIGS. 4 & 6, and described below.

TABLE 1

| Variable | Definition |
|---|---|
| $R_{int,0}$ | Time 0 internal electronic component thermal resistance, C/W. |
| $R_{int,i}$ | Time i internal electronic component thermal resistance, C/W. |
| $R_{cp,0}$ | Time 0 heat sink to coolant thermal resistance, C/W. |
| $R_{cp,i}$ | Time i heat sink to coolant thermal resistance, C/W. |
| $R_{TIM,0}$ | Time 0 thermal interface material thermal resistance, C/W. |
| $R_{TIM,i}$ | Time i thermal interface material thermal resistance, C/W. |
| $\epsilon_{cp}$ | Tolerance of heat sink thermal resistance, C/W. |
| $\epsilon_{cpslope}$ | Specified time rate of change of heat sink thermal resistance, C/W-s. |
| $\epsilon_{int}$ | Tolerance of internal electronic component thermal resistance, C/W. |
| $\epsilon_{intslope}$ | Specified time rate of change of internal electronic component thermal resistance, C/W-s. |
| $\epsilon_{TIM}$ | Tolerance for thermal interface material thermal resistance, C/W. |
| $\epsilon_{TIMslope}$ | Specified time rate of change of thermal interface material thermal resistance, C/W-s. |
| $\epsilon_{\Delta P}$ | Tolerance for liquid pressure drop across the heat sink (e.g., cold plate), Pascals. |
| $P_{w,in}$ | Pressure at the inlet of the heat sink, Pascals. |
| $P_{w,o}$ | Pressure at the exit of the heat sink, Pascals. |
| $\Delta P$ | Pressure across the heat sink = $P_{w,in} - P_{w,o}$, Pascals. |
| V | Volumetric liquid flow rate through the heat sink and the coolant loop, m³/s. |
| RPM | Pump speed in revolutions per minute. |
| f(RPM) | Function determined through lab test during design for relating liquid flow rate to pump speed. |
| $T_{w,in}$ | Liquid inlet temperature to the heat sink, ° C. |
| $T_{w,o}$ | Liquid outlet temperature from the heat sink, ° C. |
| $T_{cp}$ | Temperature at the base of the heat sink, ° C. |
| $T_{MCM}$ | Temperature at the top of the electronic component, ° C. |
| $T_d$ | Temperature of electronic component, ° C. |
| $T_{dspec}$ | Maximum temperature specification for the electronic component, ° C. |
| $Q_{MCM}$ | Power dissipation of the electronic component, W. |
| $t_i$ | Wait time, s. |

Figure 4:
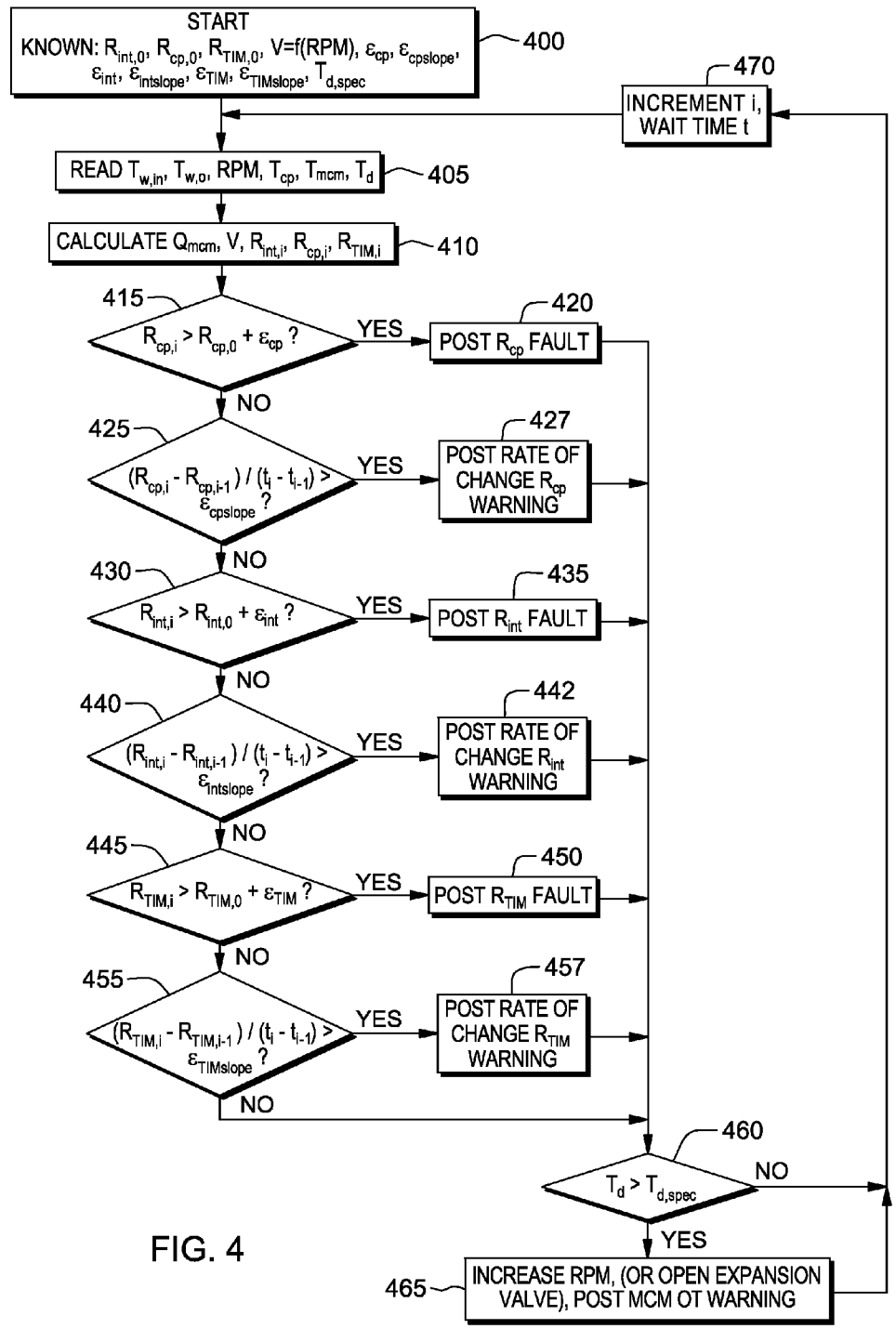
FIG. 4 depicts one embodiment of a process for monitoring cooling of an electronic component, such as one or more of the electronic components depicted in the coolant-buffered, vapor-compression refrigeration system of FIG. 3, in accordance with one or more aspects of the present invention.

As noted, FIG. 4 depicts one embodiment of a process for dynamically monitoring in situ cooling of an electronic component, such as, for example, a processor or the multichip module (MCM) noted above in connection with FIG. 3. Monitoring processing starts with obtaining known parameters including a time zero internal thermal resistance of the electronic component ($R_{int,0}$), a time zero heat sink (or cold plate) thermal resistance ($R_{cp,0}$), a time zero thermal interface material thermal resistance ($R_{TIM,0}$), a volumetric liquid flow rate (V) through the heat sink as a function of RPMs of a coolant pump within a coolant loop to which the heat sink is coupled, a tolerance heat sink thermal resistance ($\epsilon_{cp}$), a tolerance rate of change of heat sink thermal resistance ($\epsilon_{cpslope}$), a tolerance internal thermal resistance of the electronic component ($\epsilon_{int}$), a tolerance rate of change of the internal thermal resistance of the electronic component ($\epsilon_{intslope}$), a tolerance thermal interface material thermal resistance ($\epsilon_{TIM}$), a tolerance rate of change of thermal interface material thermal resistance ($\epsilon_{TIMslope}$), and a maximum specified temperature for the electronic component ($T_{dspec}$) 400. Processing reads liquid inlet temperature to the heat sink ($T_{w,i}$), liquid outlet temperature from the heat sink ($T_{w,o}$), pump speed in revolutions per minute (RPM), temperature at the base of the heat sink ($T_{cp}$), and temperature of the electronic component lid (e.g., at the top of the component lid in opposing relation to the base of the heat sink) ($T_{MCM}$), and temperature of the electronic component ($T_d$) 405. Processing then calculates power (Q) being dissipated by the electronic component, volumetric liquid flow rate (V) through the heat sink, the time i internal electronic component thermal resistance ($R_{int,i}$), the time i heat sink thermal resistance ($R_{cp,i}$), and the time i thermal interface material thermal resistance ($R_{TIM,i}$) 410. By way of example, power dissipation of the electronic component can be calculated as:

$$Q = V \rho C_p (T_{w,o} - T_{w,in})$$

where $\rho$ is the coolant density and $C_p$ is the specific heat of the fluid.

The thermal resistances (R) at time i for the electronic component ($R_{int}$), heat sink ($R_{cp}$) and thermal interface material ($R_{TIM}$) can be calculated as follows:

$$R_{int} = \frac{T_d - T_{mcm}}{Q}$$

$$R_{cp} = \frac{T_{cp} - T_{w,i}}{Q}$$

$$R_{TIM} = \frac{T_{mcm} - T_{cp}}{Q}$$

Thereafter, processing determines whether the time i thermal resistance of the heat sink ($R_{cp,i}$) is greater than the time zero thermal resistance of the heat sink ($R_{cp,0}$) plus the tolerance for the heat sink thermal resistance ($\epsilon_{cp}$) 415. If "yes", then a heat sink thermal resistance fault is posted 420. Otherwise, processing determines whether the current thermal resistance time rate of change for the heat sink, determined as time i heat sink thermal resistance ($R_{cp,i}$) minus time i–1 heat sink thermal resistance ($R_{cp,i-1}$) divided by the time interval ($t_i - t_{i-1}$), is less than the tolerance rate of change for the heat sink thermal resistance ($\epsilon_{cpslope}$) 425. If "yes", then a rate of change thermal resistance warning for the heat sink 427 is posted.

The above-described thermal resistance and rate of change evaluation processes are repeated for the electronic component, and the thermal interface material (TIM) coupling the electronic component and the heat sink.

Specifically, in the embodiment depicted, processing determines whether the time i thermal resistance of the electronic component ($R_{int,i}$) is greater than the time zero thermal resistance of the electronic component ($R_{int,0}$) plus the tolerance of the electronic component thermal resistance ($\epsilon_{int}$) 430. If "yes", then processing posts an electronic component thermal resistance fault 435. Otherwise, processing determines whether the rate of thermal resistance change of the electronic component (defined as the time i electronic component thermal resistance ($R_{int,i}$) minus the time i–1 electronic component thermal resistance ($R_{int,i-1}$), all divided by the time interval ($t_i - t_{i-1}$)), is greater than the tolerance rate of change of the electronic component's thermal resistance ($\epsilon_{intslope}$) 440. If "yes", then processing posts a rate of change thermal resistance warning for the electronic component 442.

Otherwise, processing determines whether the time i thermal interface thermal resistance ($R_{TIM,i}$) is greater than the time zero thermal interface thermal resistance ($R_{TIM,0}$) plus the tolerance of the thermal interface thermal resistance ($\epsilon_{TIM}$) 445. If "yes", then a thermal interface thermal resistance fault is posted 450. If "no", processing determines whether the rate of change of the thermal interface thermal resistance (defined as the time i thermal interface thermal resistance ($R_{TIM,i}$) minus the time i–1 thermal interface thermal resistance ($R_{TIM,i-1}$) divided by the time interval ($t_i - t_{i-1}$)), is greater than the tolerance rate of change thermal interface thermal resistance ($\epsilon_{TIMslope}$) 455. If "yes", then a rate of change warning for the thermal interface is posted 457.

After posting a fault or warning, or after evaluating the noted thermal resistances and rates of change of thermal resistance without posting a fault or warning, processing determines whether current temperature of the electronic component ($T_d$) is greater than a maximum specified temperature for the electronic component ($T_{dspec}$) 460. If "yes", then processing automatically at least one of initiates a cooling adjustment of the heat sink, initiates an operational adjustment of the electronic component, or indicates an electronic component over temperature warning 465. In the example of FIG. 4, processing increases the RPMs of one or more pumps of the coolant loop providing coolant to the heat sink, or provides greater cooling to the liquid coolant by, for example, opening an expansion valve of a refrigerant loop associated with the coolant loop (as depicted in the embodiment of FIG. 3) and issues an electronic component over temperature (OT) warning. After issuing the over temperature (OT) warning, or if the temperature of the electronic component is less than the specified maximum temperature ($T_{dspec}$), processing increments i, and waits a time interval t 470 before again reading the liquid inlet temperature to the heat sink ($T_{w,in}$), the liquid outlet temperature from the heat sink ($T_{w,o}$), RPMs of the pump associated with the coolant loop, temperature of the heat sink ($T_{cp}$), temperature of the electronic component lid ($T_{MCM}$), and temperature of the electronic component ($T_d$) 405, and repeating the above-described process.

By way of verification, a Monte Carlo Simulation Model was developed and utilized to perform an uncertainty analysis of the thermal resistance calculations noted above and employed in the monitoring process described. The electronic component (or MCM) heat load in the simulation model was assumed to be 1800 W, and the true value for the cold plate water inlet temperature ($T_{w,in}$) was 25° C., with a true value of the MCM temperature ($T_{MCM}$) of 35° C. The true value for the water flow rate was assumed to be 1 gpm. The true values are the actual values, while the measured values refer to the values that are measured by the instrumentation. There can be differences between the true and measured values for all of the measurements, which can lead to error or uncertainty in the knowledge of derived metrics, such as thermal resistance.

Additional input parameters into this model were measurement error of 5% and 10% in the measured MCM power and water flow rate values. The 5% and 10% values represent inputs for different simulations to determine the sensitivity of the uncertainty in the thermal resistance calculations for estimated errors in the measurement of the MCM heat load and coolant flow rate. Different values for the error in the temperature measurements were also assumed. This was done assuming a normal distribution for the occurrence of error in the temperature measurement, with an assumption for the 6-sigma range of the error distribution. The different 6-sigma values for distribution of temperature errors considered were 0° C., 1° C., 2° C., 4° C., and 6° C. A 6° C. value for the 6-sigma range means that the standard deviation of the error (sigma) was 1° C. The results indicate that range of percentage error in the calculation of the thermal resistance metric was 1.5%-16% for the full range of inputs considered in the uncertainty analysis. During the design process for the cooling loop depicted in FIG. 3, an estimate for these inputs to the model can be determined, leading to an estimated expected error value in the thermal resistance calculation used in the monitoring processes described. This error value for the thermal resistance may be referred to as $\epsilon_0$. $\epsilon_0$ is determined using the uncertainty analysis model during the system design. $\epsilon_{slope}$ is also determined during the design process as the acceptable rate of degradation of thermal resistance $\epsilon_0$, and $\epsilon_{slope}$ can be different for the $R_{int}$, and $R_{cp}$ and $R_{TIM}$ blocks.

Note in the above equations that the volumetric flow rate (V) can be determined as a function of pump RPMs. For example, for different RPM readings, flow rate would be measured in the lab, and from this information, a function of flow rate versus RPMs calculated, which can be readily performed by one skilled in the art.

Figure 5:
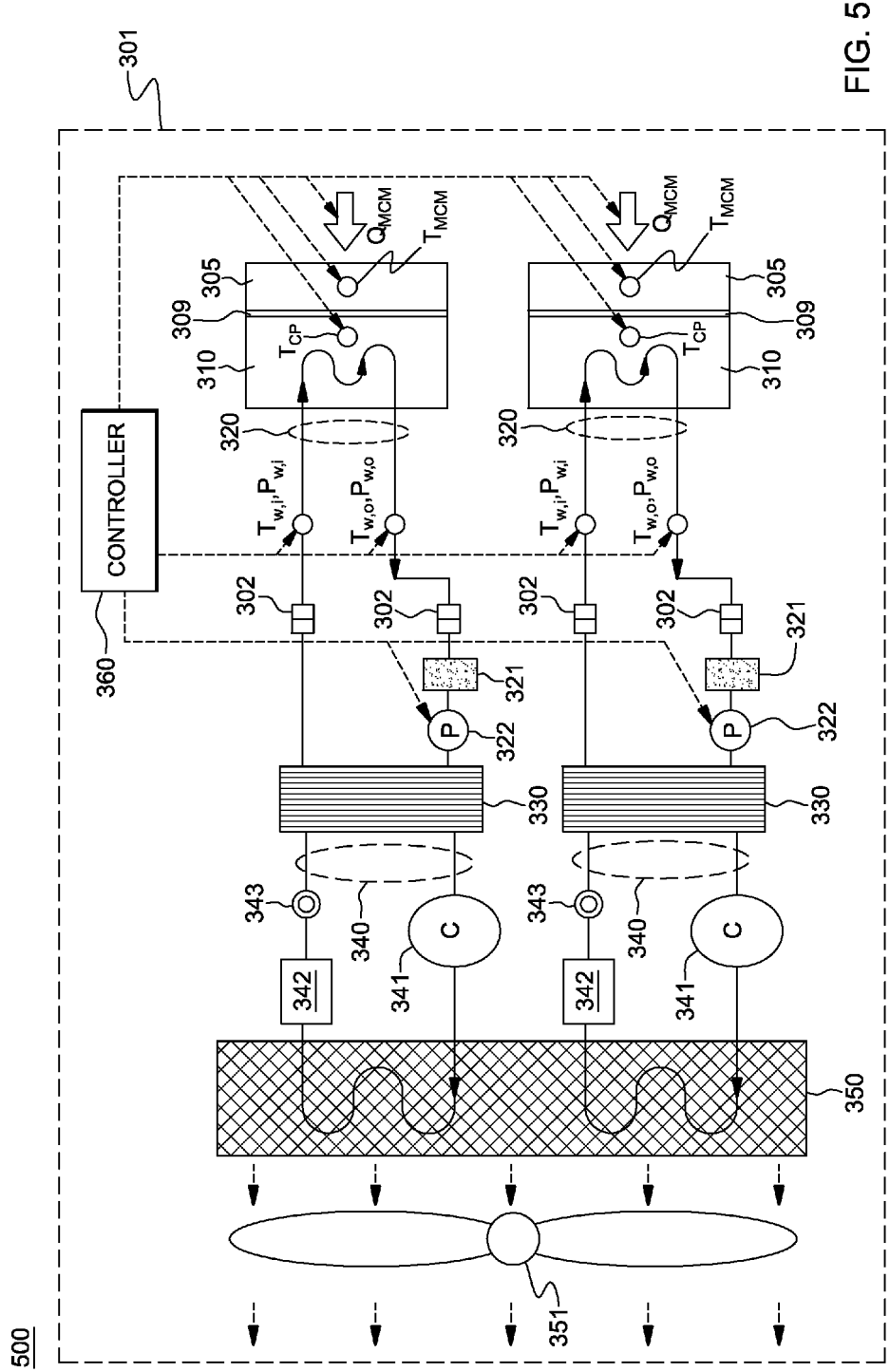
FIG. 5 is a schematic of another embodiment of a coolant-buffered, vapor-compression refrigeration system for cooling one or more heat sinks coupled to respective electronic components to be cooled, in accordance with one or more aspects of the present invention.

FIG. 5 depicts an alternate embodiment of a cooled electronic system 500, substantially identical to the above-described cooled electronic system 300 of FIG. 3. The addition in this embodiment is that pressure sensing is provided in order to determine pressure at the inlet of the heat sink ($P_{w,in}$), and pressure at the outlet of the heat sink ($P_{w,o}$), measured in Pascals. The difference in pressure across the heat sink ($\Delta P$) is defined as $P_{w,in}-P_{w,o}$, and may be used (as explained below in connection with the processing of FIG. 6) for determining whether there is a heat sink clogging fault, or a low coolant flow rate through the cold plate fault, where thermal resistance of the heat sink exceeds the thermal resistance threshold, or the rate of change of thermal resistance of the heat sink exceeds the set rate of change thermal resistance threshold for the heat sink.

Figure 6:
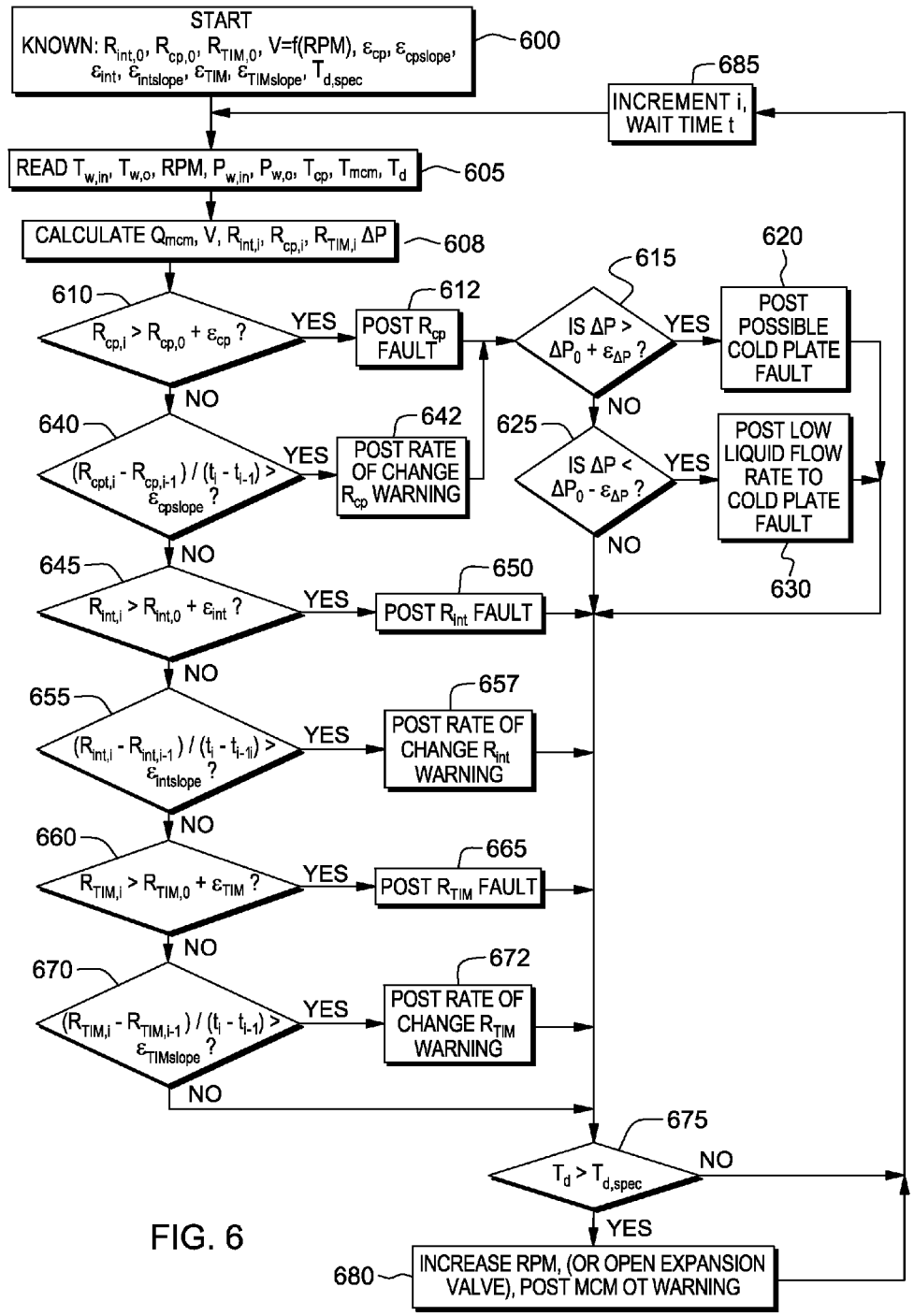
FIG. 6 depicts another embodiment of a process for monitoring cooling of an electronic component, such as one or more of the electronic components illustrated in the coolant-buffered, vapor-compression refrigeration system of FIG. 5, in accordance with one or more aspects of the present invention.

FIG. 6 depicts a monitoring process substantially identical to that described above in connection with FIG. 4, however, in FIG. 6, the sensed pressures are employed to facilitate diagnosing and repair of the cooled electronic system by determining whether there is a potential cold plate clogging fault, or a low coolant rate through the cold plate fault.

Referring to FIG. 6, the monitoring process starts with obtaining known parameters including a time zero internal thermal resistance of the electronic component ($R_{int,0}$), a time zero heat sink thermal resistance ($R_{cp,0}$), a time zero thermal interface material thermal resistance ($R_{TIM,0}$), a volumetric liquid flow rate (V) through the heat sink as a function of RPMs of the coolant pump within the coolant loop to which the heat sink is coupled, a tolerance heat sink thermal resistance ($\epsilon_{cp}$), a tolerance rate of change of heat sink thermal resistance ($\epsilon_{cpslope}$), a tolerance internal thermal resistance of the electronic component ($\epsilon_{int}$), a tolerance rate of change of the internal thermal resistance of the electronic component ($\epsilon_{intslope}$), a tolerance thermal interface material thermal resistance ($\epsilon_{TIM}$), a tolerance rate of change of thermal interface material thermal resistance ($\epsilon_{TIMslope}$), and a maximum specified temperature for the electronic component ($T_{dspec}$) 600. Processing reads liquid inlet temperature to the heat sink ($T_{w,in}$), liquid outlet temperature from the heat sink ($T_{w,o}$), pump speed in revolutions per minute (RPM), pressure at the inlet of the heat sink ($P_{w,in}$), pressure at the outlet of the heat sink ($P_{w,o}$), temperature at the base of the heat sink ($T_{cp}$), temperature of the electronic component lid (e.g., at the top of the component in opposing relation to the base of the heat sink) ($T_{MCM}$), and temperature of the electronic component ($T_d$) 605. Processing then calculates power (Q) dissipated by the electronic component, volumetric liquid flow rate (V) through the heat sink, the time i internal electronic component thermal resistance ($R_{int,i}$), the time i heat sink thermal resistance ($R_{cp,i}$), and the time i thermal interface material thermal resistance ($R_{TIM}$) 608.

Thereafter, processing determines whether the time i thermal resistance of the heat sink ($R_{cp,i}$) is greater than the time zero thermal resistance of the heat sink ($R_{cp,0}$) plus the tolerance for the heat sink thermal resistance ($\epsilon_{cp}$) 610. If "yes", then a heat sink thermal resistance fault is posted 612. Otherwise, processing determines whether the current thermal resistance time rate of change for the heat sink, determined as time i heat sink thermal resistance ($R_{cp,i}$) minus time i-1 heat sink thermal resistance ($R_{cp,i-1}$) divided by the time interval ($t_i-t_{i-1}$), is less than the tolerance rate of change for the heat sink thermal resistance ($\epsilon_{cpslope}$) 640. If "yes", then a rate of change thermal resistance warning for the heat sink 642 is posted.

After posting a heat sink thermal resistance fault 612 or posting a rate of change thermal resistance warning 642, processing determines whether the pressure across the heat sink ($\Delta P$) is greater than the set point pressure across the heat sink ($\Delta P_0$) plus the tolerance for the liquid pressure drop across the heat sink ($\epsilon_{\Delta P}$) 615. If "yes", then a heat sink fault is posted 620. If "no", then processing determines whether the pressure drop across the heat sink ($\Delta P$) is less than the set point pressure drop across the heat sink ($\Delta P_0$) minus the tolerance for the liquid pressure drop across the heat sink ($\epsilon_{\Delta P}$) 625, and if "yes", a low liquid flow rate to the heat sink fault is posted 630. After evaluating coolant pressure, processing continues as explained further below.

Assuming that the heat sink thermal resistance is acceptable, processing determines whether the time i thermal resistance of the electronic component ($R_{int,i}$) is greater than the time zero thermal resistance of the electronic component ($R_{int,0}$) plus the tolerance of the electronic component thermal resistance ($\epsilon_{int}$) 645. If "yes", then processing posts an electronic component thermal resistance fault 650. Otherwise, processing determines whether the rate of thermal resistance change of the electronic component (defined as the time i electronic component thermal resistance ($R_{int,i}$) minus the time i-1 electronic component thermal resistance ($R_{int,i-1}$), divided by the time interval ($t_i-t_{i-1}$)), is greater than the tolerance rate of change of the electronic component's thermal resistance ($\epsilon_{intslope}$) 655. If "yes", then processing posts a rate of change thermal resistance warning for the electronic component 657.

Otherwise, processing determines whether the time i thermal interface thermal resistance ($R_{TIM,i}$) is greater than the time zero thermal interface thermal resistance ($R_{TIM,0}$) plus the tolerance of the thermal interface thermal resistance ($\epsilon_{TIM}$) 660. If "yes", then a thermal interface thermal resistance fault is posted 665. If "no", processing determines whether the rate of change of the thermal interface thermal resistance (defined as the time i thermal interface thermal resistance ($R_{TIM,i}$) minus the time i-1 thermal interface thermal resistance ($R_{TIM,i-1}$), divided by the time interval ($t_i-t_{i-1}$)) is greater than the tolerance rate of change thermal interface thermal resistance ($\epsilon_{TIMslope}$) 670. If "yes", then a rate of change warning for the thermal interface is posted 672.

After posting a fault or warning, or after evaluating the noted thermal resistances and rates of change of thermal resistance without posting a fault or warning, processing determines whether current temperature of the electronic component ($T_d$) is greater than a maximum specified temperature for the electronic component ($T_{dspec}$) 675. If "yes", then processing automatically at least one of initiates a cooling adjustment of the heat sink, initiates an operational adjustment of the electronic component, or indicates an electronic component over temperature warning 680. In the example of FIG. 6, processing increases the RPMs of the pump of the coolant loop providing liquid coolant to the heat sink, or provides greater cooling to the liquid coolant by, for example, opening an expansion valve of a refrigerant loop associated with the coolant loop (as depicted in the embodiment of FIGS. 3 & 5) and issues an electronic component over temperature (OT) warning. After issuing the over temperature (OT) warning, or if the temperature of the electronic component is less than the specified maximum temperature ($T_{dspec}$), processing increments i, and waits a time interval t 685 before repeating the monitoring process.

As will be appreciated by one skilled in the art, control aspects of the present invention may be embodied as a system, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system". Furthermore, control aspects of the present invention may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable signal medium may be any non-transitory computer readable medium that is not a computer readable storage medium and that can communicate, propagate, or transport a program for use by or in connection with an instruction execution system, apparatus or device.

A computer readable storage medium may be, for example, but not limited to, an electronic, magnetic, optical, electromagnetic, infrared or semiconductor system, apparatus, or device, or any suitable combination of the foregoing. More specific examples (a non-exhaustive list) of the computer readable storage medium include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain or store a program for use by or in connection with an instruction execution system, apparatus, or device.

Figure 7:
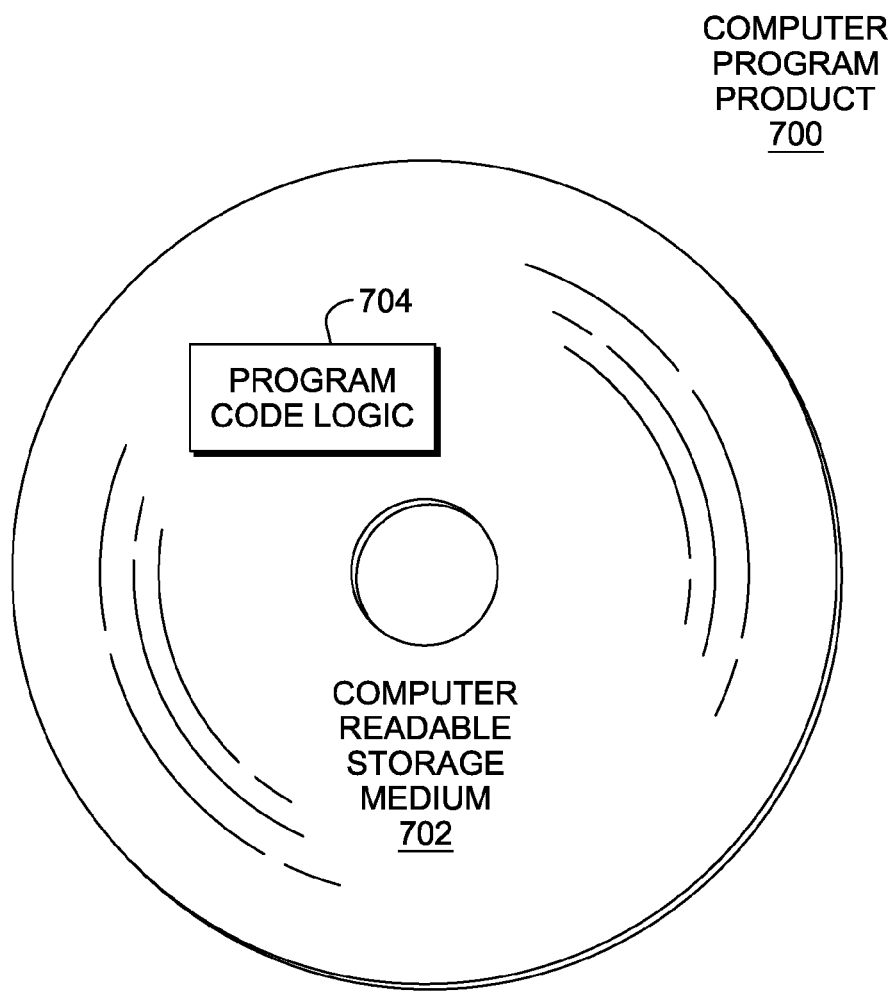
FIG. 7 depicts one embodiment of a computer program product incorporating one or more aspects of the present invention.

Referring now to FIG. 7, in one example, a computer program product 700 includes, for instance, one or more computer readable storage media 702 to store computer readable program code means or logic 704 thereon to provide and facilitate one or more aspects of the present invention.

Program code embodied on a computer readable medium may be transmitted using an appropriate medium, including but not limited to wireless, wireline, optical fiber cable, RF, etc., or any suitable combination of the foregoing.

Computer program code for carrying out operations for aspects of the present invention may be written in any combination of one or more programming languages, including an object oriented programming language, such as Java, Smalltalk, C++ or the like, and conventional procedural programming languages, such as the "C" programming language, assembler or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described herein with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

The flowchart and block diagrams in the figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

In addition to the above, one or more aspects of the present invention may be provided, offered, deployed, managed, serviced, etc. by a service provider who offers management of customer environments. For instance, the service provider can create, maintain, support, etc. computer code and/or a computer infrastructure that performs one or more aspects of the present invention for one or more customers. In return, the service provider may receive payment from the customer under a subscription and/or fee agreement, as examples. Additionally or alternatively, the service provider may receive payment from the sale of advertising content to one or more third parties.

In one aspect of the present invention, an application may be deployed for performing one or more aspects of the present invention. As one example, the deploying of an application comprises providing computer infrastructure operable to perform one or more aspects of the present invention.

As a further aspect of the present invention, a computing infrastructure may be deployed comprising integrating computer readable code into a computing system, in which the code in combination with the computing system is capable of performing one or more aspects of the present invention.

As yet a further aspect of the present invention, a process for integrating computing infrastructure comprising integrating computer readable code into a computer system may be provided. The computer system comprises a computer readable medium, in which the computer medium comprises one or more aspects of the present invention. The code in combination with the computer system is capable of performing one or more aspects of the present invention.

Although various embodiments are described above, these are only examples. For example, computing environments of other architectures can incorporate and use one or more aspects of the present invention. Additionally, the network of nodes can include additional nodes, and the nodes can be the same or different from those described herein. Also, many types of communications interfaces may be used.

Further, a data processing system suitable for storing and/or executing program code is usable that includes at least one processor coupled directly or indirectly to memory elements through a system bus. The memory elements include, for instance, local memory employed during actual execution of the program code, bulk storage, and cache memory which provide temporary storage of at least some program code in order to reduce the number of times code must be retrieved from bulk storage during execution.

Input/Output or I/O devices (including, but not limited to, keyboards, displays, pointing devices, DASD, tape, CDs, DVDs, thumb drives and other memory media, etc.) can be coupled to the system either directly or through intervening I/O controllers. Network adapters may also be coupled to the system to enable the data processing system to become coupled to other data processing systems or remote printers or storage devices through intervening private or public networks. Modems, cable modems, and Ethernet cards are just a few of the available types of network adapters.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprise" (and any form of comprise, such as "comprises" and "comprising"), "have" (and any form of have, such as "has" and "having"), "include" (and any form of include, such as "includes" and "including"), and "contain" (and any form contain, such as "contains" and "containing") are open-ended linking verbs. As a result, a method or device that "comprises", "has", "includes" or "contains" one or more steps or elements possesses those one or more steps or elements, but is not limited to possessing only those one or more steps or elements. Likewise, a step of a method or an element of a device that "comprises", "has", "includes" or "contains" one or more features possesses those one or more features, but is not limited to possessing only those one or more features. Furthermore, a device or structure that is configured in a certain way is configured in at least that way, but may also be configured in ways that are not listed.

The corresponding structures, materials, acts, and equivalents of all means or step plus function elements in the claims below, if any, are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to explain the principles of the invention and the practical application, and to enable others of ordinary skill in the art to understand the invention through various embodiments and the various modifications thereto which are dependent on the particular use contemplated.

What is claimed is:

1. A method comprising:
   monitoring cooling of an electronic component, the monitoring comprising:
      determining a current thermal resistance associated with at least one of the electronic component, a heat sink coupled to the electronic component, or a thermal interface coupling the electronic component and the heat sink;
      determining, by a processor, whether the current thermal resistance exceeds a set thermal resistance threshold, and responsive to the current thermal resistance exceeding the set thermal resistance threshold, indicating a thermal resistance fault; and
      determining a rate of change over time of the thermal resistance associated with the at least one of the electronic component, the heat sink coupled to the electronic component, or the thermal interface coupling the electronic component and the heat sink, and determining, by the processor, whether the rate of change over time of the thermal resistance exceeds a set rate of change threshold, and responsive to the rate of change over time of the thermal resistance exceeding the set rate change threshold, indicating a rate of change thermal resistance warning.

2. The method of claim 1, wherein determining the current thermal resistance comprises determining a current thermal resistance associated with the heat sink and the determining, by the processor, whether the current thermal resistance exceeds the set thermal resistance threshold comprises determining, by the processor, whether the current thermal resistance associated with the heat sink exceeds a set thermal resistance threshold for the heat sink, and responsive to the current thermal resistance exceeding the set thermal resistance threshold for the heat sink, automatically indicating a heat sink thermal resistance fault.

3. The method of claim 2, wherein determining the rate of change over time of thermal resistance comprises determining the rate of change over time of thermal resistance associated with the heat sink, and determining, by the processor, whether the rate of change over time of the thermal resistance associated with the heat sink exceeds a set rate of change threshold for the heat sink, and responsive to the rate of change over time of the thermal resistance associated with the heat sink exceeding the set rate of change threshold for the heat sink, indicating a rate of change thermal resistance warning for the heat sink, and wherein the heat sink comprises a liquid-cooled structure, and the method further comprises:
   responsive to the current thermal resistance exceeding the set thermal resistance threshold for the heat sink, or the rate of change over time of the thermal resistance exceeding the set rate of change threshold for the heat sink, determining whether there is a liquid flow obstruction associated with the heat sink or a low liquid flow rate to the heat sink.

4. The method of claim 1, wherein determining the current thermal resistance comprises determining a current thermal resistance associated with the electronic component, and the determining, by the processor, whether the current thermal resistance exceeds a set thermal resistance threshold, comprises determining, by the processor, whether the current thermal resistance associated with the electronic component exceeds a set thermal resistance threshold for the electronic component, and responsive to the current thermal resistance associated with the electronic component exceeding the set thermal resistance threshold associated with electronic component, automatically indicating an electronic component thermal resistance fault.

5. The method of claim 1, wherein determining the current thermal resistance comprises determining current thermal resistance associated with the thermal interface coupling the electronic component and the heat sink, and the determining, by the processor, whether the current thermal resistance exceeds the set thermal resistance threshold comprises determining, by the processor, whether the current thermal resistance associated with the thermal interface exceeds a set thermal resistance threshold for the thermal interface, and responsive to the current thermal resistance associated with the thermal interface exceeding the set thermal resistance threshold for the thermal interface, automatically indicating a thermal interface, thermal resistance fault.

6. The method of claim 1, further comprising determining multiple current thermal resistances, the multiple current thermal resistances comprising a current thermal resistance associated with the heat sink, and a current thermal resistance associated with the electronic component, and determining, by the processor, whether the current thermal resistance associated with the heat sink exceeds a set thermal resistance threshold for the heat sink, and determining, by the processor, whether the current thermal resistance associated with electronic component exceeds a set thermal resistance threshold for the electronic component, and responsive to the current thermal resistance associated with the heat sink exceeding the set thermal resistant threshold for the heat sink, automatically indicating a heat sink thermal resistance fault, and responsive to the current thermal resistance associated with the electronic component exceeding the set thermal resistance threshold for the electronic component, automatically indicating an electronic component thermal resistance fault.

7. The method of claim 6, wherein determining the multiple current thermal resistances further comprises determining a current thermal resistance associated with the thermal interface coupling the electronic component and the heat sink, and the determining, by the processor, whether the current thermal resistance exceeds a set thermal resistant threshold comprises determining, by the processor, whether the current thermal resistance associated with the thermal interface exceeds a set thermal resistance threshold for the thermal interface, and responsive to the current thermal resistance associated with the thermal interface exceeding the set thermal resistance threshold for the thermal interface, indicating a thermal interface, thermal resistance fault.

8. The method of claim 7, further comprising determining whether an electronic component temperature exceeds a specified electronic component temperature, and responsive to the electronic component temperature exceeding the specified electronic component temperature, automatically at least one of initiating a cooling adjustment of the heat sink, initiating an operational adjustment of the electronic component, or indicating an electronic component over temperature warning.

9. The method of claim 1, wherein determining the current thermal resistance comprises determining the current thermal resistance associated with the heat sink, and determining, by the processor, the rate of change over time of the thermal resistance comprises determining, by the processor, a rate of change over time of the thermal resistance associated with the heat sink, and responsive to the rate of change over time of the thermal resistance associated with the heat sink exceeding a set rate of change threshold for the heat sink, indicating the rate of change thermal resistance warning for the heat sink.

10. The method of claim 1, wherein determining the current thermal resistance comprises determining the current thermal resistance associated with the electronic component, and determining, by the processor, the rate of change over time of the thermal resistance comprises determining, by the processor, a rate of change over time of the thermal resistance associated with the electronic component, and responsive to the rate of change over time of the thermal resistance associated with the electronic component exceeding a set rate of change threshold for the electronic component, indicating the rate of change thermal resistance warning for the electronic component.

11. The method of claim 1, wherein determining the current thermal resistance comprises determining the current thermal resistance associated with the thermal interface coupling the electronic component and the heat sink, and determining, by the processor, the rate of change over time of the thermal resistance comprises determining, by the processor, a rate of change over time of the thermal resistance associated with the thermal interface, and responsive to the rate of change over time of the thermal resistance associated with the thermal interface exceeding a set rate of change threshold for the thermal interface, indicating the rate of change thermal resistance warning for the thermal interface.

12. A cooling apparatus comprises:
a heat sink;
a thermal interface coupling the heat sink to an electronic component to be cooled; and
a controller for monitoring cooling of the electronic component, the monitoring comprising:
determining a current thermal resistance associated with at least one of the electronic component, a heat sink coupled to the electronic component, or a thermal interface coupling the electronic component and the heat sink;
determining whether the current thermal resistance exceeds a set thermal resistance threshold, and responsive to the current thermal resistance exceeding the set thermal resistance threshold, indicating a thermal resistance fault; and
determining a rate of change over time of the thermal resistance associated with the at least one of the electronic component the heat sink coupled to the electronic component, or the thermal interface coupling the electronic component and the heat sink, and determining, by the processor, whether the rate of change over time of the thermal resistance exceeds a set rate of change threshold, and responsive to the rate of change over time of the thermal resistance exceeding the set rate change threshold, indicating a rate of change thermal resistance warning.

13. The cooling apparatus of claim 12, wherein determining the current thermal resistance comprises determining a current thermal resistance associated with the heat sink and the determining, by the processor, whether the current thermal resistance exceeds the set thermal resistance threshold comprises determining, by the processor, whether the current thermal resistance associated with the heat sink exceeds a set thermal resistance threshold for the heat sink, and responsive to the current thermal resistance exceeding the set thermal resistance threshold for the heat sink, automatically indicating a heat sink thermal resistance fault.

14. The cooling apparatus of claim 12, wherein determining the current thermal resistance comprises determining a current thermal resistance associated with the electronic component, and the determining, by the processor, whether the current thermal resistance exceeds a set thermal resistance threshold, comprises determining, by the processor, whether the current thermal resistance associated with the electronic component exceeds a set thermal resistance threshold for the electronic component, and responsive to the current thermal resistance associated with the electronic component exceeding the set thermal resistance threshold associated with electronic component, automatically indicating an electronic component thermal resistance fault.

15. The cooling apparatus of claim 12, wherein determining the current thermal resistance comprises determining current thermal resistance associated with the thermal interface coupling the electronic component and the heat sink, and the determining, by the processor, whether the current thermal resistance exceeds the set thermal resistance threshold comprises determining, by the processor, whether the current thermal resistance associated with the thermal interface exceeds a set thermal resistance threshold for the thermal interface, and responsive to the current thermal resistance associated with the thermal interface exceeding the set thermal resistance threshold for the thermal interface, automatically indicating a thermal interface, thermal resistance fault.

16. The cooling apparatus of claim 12, wherein determining the current thermal resistance comprises determining the current thermal resistance associated with the thermal interface coupling the electronic component and the heat sink, and the determining, by the processor, the rate of change over time of the thermal resistance comprises determining, by the processor, a rate of change over time of the thermal resistance associated with the thermal interface, and responsive to the rate of change over time of the thermal resistance associated with the thermal interface exceeding a set rate of change threshold for the thermal interface, indicating a rate of change thermal resistance warning for the thermal interface.

17. A cooled electronic system comprising;
an electronic component;
a heat sink;
a thermal interface coupling the electronic component and the heat sink; and
a controller configured to monitor cooling of the electronic component, the monitoring comprising:
  determining a current thermal resistance associated with at least one of the electronic component, the heat sink coupled to the electronic component, or the thermal interface coupling the electronic component and the heat sink;
  determining whether the current thermal resistance exceeds a set thermal resistance threshold, and responsive to the current thermal resistance exceeding the set thermal resistance threshold, indicating a thermal resistance fault; and
  determining a rate of change over time of the thermal resistance associated with the at least one of the electronic component, the heat sink coupled to the electronic component, or the thermal interface coupling the electronic component and the heat sink, and determining, by the processor, whether the rate of change over time of the thermal resistance exceeds a set rate of change threshold, and responsive to the rate of change over time of the thermal resistance exceeding the set rate change threshold, indicating a rate of change thermal resistance warning.

* * * * *